US008885968B2

(12) United States Patent
Honda (10) Patent No.: US 8,885,968 B2
(45) Date of Patent: Nov. 11, 2014

(54) METHOD AND APPARATUS FOR IMAGE SIGNAL PROCESSING (75) Inventor: Kazuhiro Honda, Tokyo (JP)

(73) Assignee: JEOL Ltd., Tokyo (JP)

( * ) Notice: Subject to any disclaimer, the term of this patent is extended or adjusted under 35 U.S.C. 154(b) by 210 days.

(21) Appl. No.: 13/611,579

(22) Filed: Sep. 12, 2012

(65) Prior Publication Data
US 2013/0241633 A1    Sep. 19, 2013

(30) Foreign Application Priority Data

Sep. 13, 2011 (JP) ................................. 2011-199507

(51) Int. Cl.
G06K 9/40 (2006.01)
H03K 5/1252 (2006.01)
G06T 5/00 (2006.01)
(52) U.S. Cl.
CPC .............. *H03K 5/1252* (2013.01); *G06T 5/001* (2013.01); *G06T 2207/10061* (2013.01); *G06T 2207/30168* (2013.01)
USPC .......................................... 382/264; 382/260
(58) Field of Classification Search
CPC ................................................. H01J 2237/2823
See application file for complete search history.

(56) References Cited

U.S. PATENT DOCUMENTS

| | | | | |
|---|---|---|---|---|
| 5,173,776 A | * | 12/1992 | Rigg et al. | 348/673 |
| 6,114,681 A | * | 9/2000 | Komatsu | 250/201.3 |
| 6,960,764 B2 | * | 11/2005 | Dirksen et al. | 250/307 |
| 7,408,154 B2 | * | 8/2008 | Oosaki et al. | 250/307 |
| 7,533,000 B2 | * | 5/2009 | Statham et al. | 702/179 |
| 2004/0173748 A1 | * | 9/2004 | Dirksen et al. | 250/310 |
| 2005/0247860 A1 | * | 11/2005 | Shishido et al. | 250/210 |
| 2010/0264309 A1 | * | 10/2010 | Hirose et al. | 250/310 |

FOREIGN PATENT DOCUMENTS

JP          200979949 A       4/2009

OTHER PUBLICATIONS

K.S. SIM1, M.E. NIA1, C.P. TSO2 , Performance of new signal-to-noise ratio estimation for SEM images based on single image noise cross-correlation , Issue Journal of Microscopy, Journal of Microscopy, vol. 248, Issue 2, pp. 120-128, Nov. 2012.*
Sim et al, Single Image Signal-to-Noise Ratio Estimation for Magnetic Resonance Image, Journal of Medical Systems archive vol. 35 Issue 1, Feb. 2011 pp. 39-48.*
Sim, K. S., Chuah, H. T., and Zheng, C., Performance of a mixed Lagrange time delay estimation autoregressive (MLTDEAR) model for single-image signal-to-noise ratio estimation in scanning electron microscopy. J. Microsc. 219 (1)1-17, 2005.*

* cited by examiner

*Primary Examiner* — Andrae S Allison
(74) *Attorney, Agent, or Firm* — The Webb Law Firm (57) ABSTRACT Image signal processing method and apparatus having a first filter storage portion in which first filters are correlatively stored; a second filter storage portion in which second filters are correlatively stored; a first filter selection portion for selecting a first filter based on the power spectrum of the input image; a second filter selection portion for selecting a second filter based on the S/N (signal-to-noise ratio) of the input image; a third filter creation portion for creating a third filter by summing up the first and second filters; and a convolutional processing portion for convolving the input image using the created third filter.

8 Claims, 9 Drawing Sheets

METHOD AND APPARATUS FOR IMAGE SIGNAL PROCESSING

BACKGROUND OF THE INVENTION

1. Field of the Invention

The present invention relates to a method and apparatus for signal processing.

2. Description of Related Art

Techniques for performing image processing such as edge enhancement and blurring using a convolution filter such as a Laplacian filter or Gaussian filter are known from the past (see, for example, JP-A-2009-79949).

However, related art techniques do not have any filter that acts precisely on any arbitrary input image. Consequently, it has been required to use a filter whose parameters have been adjusted by assuming input images. Furthermore, a wavelet algorithm that expands an input image into image elements of plural resolutions is known. The input image is expanded into a series of image elements which are half as many as there are pixels. Therefore, the resolutions differ greatly. This presents the problem that it is impossible to finely adjust the image quality. Another problem with wavelet analysis is that an exorbitantly long time is required to process a large image because the input image is expanded.

SUMMARY OF THE INVENTION

In view of the foregoing problems, the present invention has been made. According to some embodiments of the invention, it is possible to offer an image processing method and apparatus capable of acting on and processing various input signals in a short time.

(1) A method for signal processing associated with the present invention starts with calculating a power spectrum of an input signal. A power spectrum approximate to the calculated power spectrum is selected from a plurality of power spectra stored in a first filter storage portion. A first filter corresponding to the selected power spectrum is selected from a plurality of first filters stored in the first filter storage portion. This processing step may be hereinafter referred to as the first filter selection step. Then, the S/N (signal-to-noise ratio) of the input signal is calculated. An S/N approximate to the calculated S/N is selected from a plurality of S/Ns stored in a second filter storage portion. A second filter corresponding to the selected S/N is selected from a plurality of second filters stored in the second filter storage portion. This processing step may be hereinafter referred to as the second filter selection step. The selected first and second filters are summed up to create a third filter. This processing step may be hereinafter referred to as the third filter creation step. The input signal is convolved using the created third filter. This processing step may be hereinafter referred to as the convolution step.

According to the present invention, a first filter selected based on the power spectrum of an input signal is added to a second filter selected based on the S/N of the input signal, thus a third filter is created. The input signal is convolved using the third filter. Consequently, the input signal can be processed using the filter adapted for the input signal in a short time.

(2) In a method for signal processing associated with the present invention, the first filters stored in the first filter storage portion have been created based on sample input signals by a filter creation step and are correlated with power spectra of the sample input signals. The second filters stored in the second filter storage portion have been created by the filter creation step and are correlated with S/Ns of the sample input signals. During the filter creation step, a filter of an arbitrary distribution function $G_0$ is expanded into a series of n filter elements (where n is an arbitrary number) each of which is the difference between two distribution functions. The coefficients of the filter elements are set at will. The filter elements are multiplied by their respective coefficients and summed up. Thus, the first filter that is a function of the number of the filter elements n and of the coefficients of the filter elements is created. The distribution function $G_n$ of the nth order is obtained when the filter is expanded into the arbitrary number n of filter elements. The distribution function $G_n$ and the distribution function $G_0$ are combined with arbitrary weight coefficients to create second filters. The value of the number n, the coefficients of the filter elements, and the weight coefficients may be set based on the sample input signals.

According to the present invention, the first filter adapted for the sample input signal can be created by setting the value of the number n and the coefficients of the filter elements based on the sample input signal. Furthermore, the second filter adapted for the sample input signal can be created by setting the value of the number n and the weight coefficient based on the sample input signal. Plural first filters and plural second filters are created based on sample input signals. A first filter selected from the created first filters based on a power spectrum of an input signal and a second filter selected from the created second filters based on the S/N of the input signal are summed up to create a third filter. The input signal is convolved using the third filter. Consequently, signal processing can be performed in a short time using the filter adapted for the input signal.

(3) In the signal processing method associated with the present invention, during the filter creation step, the value of the number n, the coefficients of the filter elements, and the weight coefficients may be set to maximize the S/Ns of the signals obtained by convolving the sample input signals using the created first and second filters.

According to the present invention, the first and second filters adapted for the sample input signal can be created.

(4) In the method of signal processing associated with the present invention, each of the distribution functions may be a Gaussian function.

Furthermore, the distribution function $G_n$ of the nth order may be a Gaussian function. The distribution function $G_0$ may be a function approximate to a delta function.

(5) An apparatus for signal processing associated with the present invention has: a first filter storage portion in which first filters created based on sample input signals and power spectra of the sample input signals are correlatively stored; a second filter storage portion in which second filters created based on sample input signals and S/Ns of the sample input signals are correlatively stored; a first filter selection portion for calculating a power spectrum of an input signal, selecting a power spectrum approximate to the calculated power spectrum from the power spectra stored in the first filter storage portion, and selecting a first filter corresponding to the selected power spectrum from the first filters stored in the first filter storage portion; a second filter selection portion for calculating an S/N of the input signal, selecting an S/N approximate to the calculated S/N from the S/Ns stored in the second filter storage portion, and selecting a second filter corresponding to the selected S/N from the second filters stored in the second filter storage portion; a third filter creation portion for creating a third filter by summing up the selected first and second filters; and a convolutional processing portion for convolving the input signal using created third filter.

According to the present invention, a first filter selected based on the power spectrum of the input signal and a second filter selected based on the S/N of the input signal are summed up to create a third filter. The input signal is convolved using the third filter. Consequently, signal processing can be performed in a short time using a filter adapted for the input signal.

(6) The apparatus for signal processing associated with the present invention may further include a filter creation portion for creating the first and second filters based on the sample input signals and calculating power spectra and S/Ns of the sample input signals. The filter creation portion may expand a filter of an arbitrary distribution function $G_0$ into a series of n filter elements (where n is an arbitrary number) each of which is the difference between two distribution functions, set coefficients of the filter elements at will, multiply the filter elements by the coefficients, respectively, sum up the multiplied filter elements to create a first filter that is a function of the number of the filter elements n and of the coefficients of the filter elements, obtain a distribution function $G_n$ of the nth order when the filter is expanded into the n filter elements, combine together the distribution function $G_n$ and the distribution function $G_0$ with an arbitrary weight coefficient to obtain a second filter, and set the value of the number n, the coefficients of the filter elements, and the weight coefficients based on the sample input signals.

According to the present invention, first filters adapted for sample input signals can be created by setting the value of the number n and the coefficients of the filter elements based on the sample input signals. Second filters adapted for sample input signals can be created by setting the value of the number n and the weight coefficient based on the sample input signals. A first filter is selected according to a power spectrum of an input signal from the first filters created based on the sample input signals. A second filter is selected according to an S/N of the input signal from the second filters created on the basis of the sample input signals. The selected first and second filters are summed up to create a third filter. The input signal is convolved using the third filter. Consequently, signal processing can be performed in a short time using the filter adapted for the input signal.

(7) In the apparatus for signal processing associated with the present invention, the filter creation portion may set the value of the number n, the coefficients of the filter elements, and the weight coefficients to maximize the S/Ns of the signals obtained by convolving the sample input signals using the created first and second filters.

According to the present invention, the first and second filters adapted for sample input signals can be created.

(8) In the apparatus for signal processing associated with the present invention, each of the distribution functions may be a Gaussian function.

Furthermore, the distribution function $G_n$ of the nth order may be a Gaussian function. The distribution function $G_0$ may be a function approximate to a delta function.

DESCRIPTION OF THE PREFERRED EMBODIMENTS

The preferred embodiments of the present invention are hereinafter described in detail with reference to the drawings. It is to be understood that embodiments described below do not unduly restrict the contents of the invention delineated by the appended claims and that all the configurations described below are not always essential constituent components of the present invention.

1. Configuration

Figure 1:
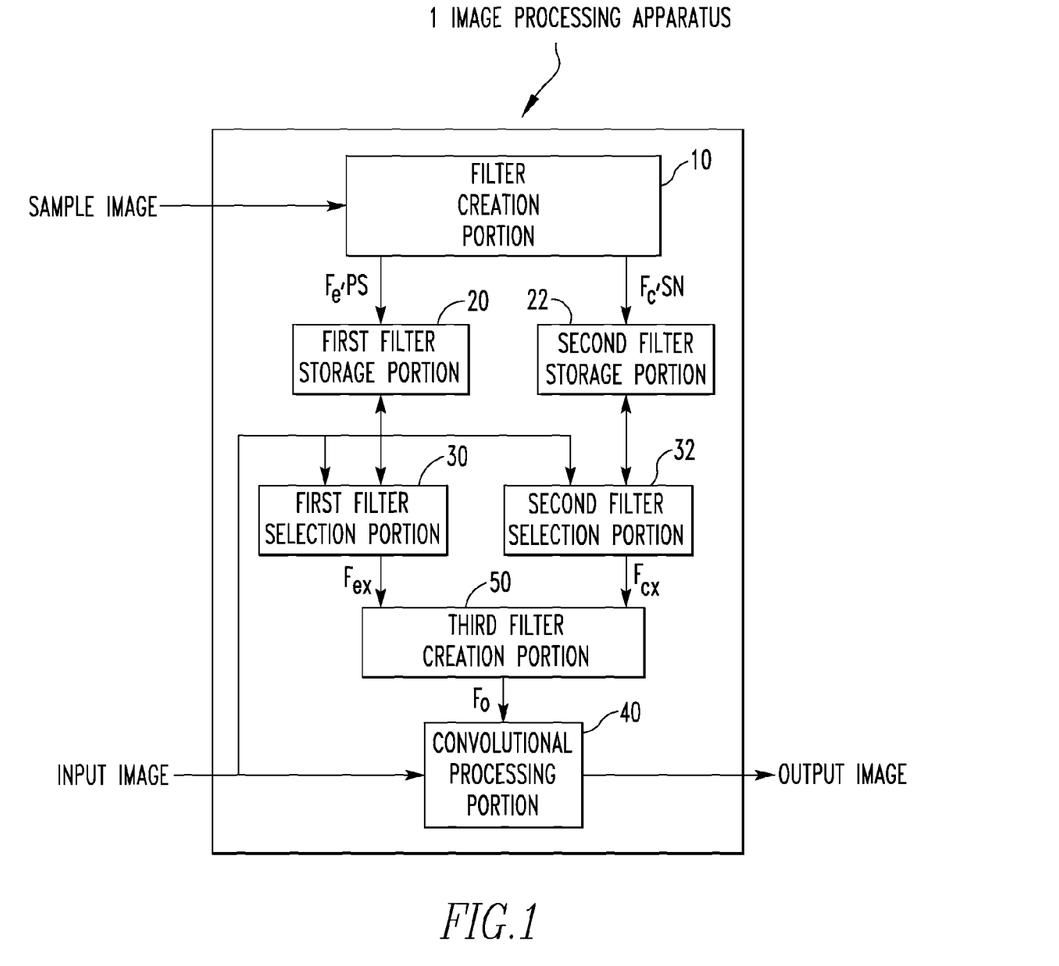
FIG. 1 is a functional block diagram of an image processing apparatus (one example of signal processing apparatus) associated with one embodiment of the present invention.

FIG. 1 is a functional block diagram of an image processing apparatus associated with one embodiment of the present invention, the image processing apparatus being one example of signal processing apparatus. Note that some of the constituent elements of the image processing apparatus of the present embodiment shown in FIG. 1 may be omitted.

The image processing apparatus, generally indicated by reference numeral 1, of the present embodiment is an apparatus for performing image processing to vary the image quality (resolution) of an input SEM image that is represented by an input signal and taken by a scanning electron microscope (SEM). The apparatus is configured including a filter creation portion 10, a first filter storage portion 20, a second filter storage portion 22, a first filter selection portion 30, a second filter selection portion 32, and a third filter creation portion 50, and a convolutional processing portion 40. The functions of the filter creation portion 10, the first filter selection portion 30, the second filter selection portion 32, the third filter creation portion 50, and the convolutional processing portion 40 can be accomplished by various processors (such as CPU and DSP) or computer programs. The functions of the first filter storage portion 20 and the second filter storage portion 22 can be realized by a RAM, a hard disk, or the like.

The filter creation portion 10 creates first and second filters based on a sample image represented by a sample input signal, calculates a power spectrum and the signal-to-noise ratio (S/N) of the sample image, outputs the created first filter and the calculated power spectrum to the first filter storage portion 20, and outputs the created second filter and the calculated S/N to the second filter storage portion 22.

The filter creation portion 10 expands a filter that is an arbitrary distribution function $G_0$ (e.g., a function approximate to a delta function) into a series of n filter elements (where n is an arbitrary number) each of which is the difference between two distribution functions (e.g., two-dimensional Gaussian functions), sets the coefficients of the filter elements at will, multiplies the filter elements by the coefficients, adds up the multiplied filter elements to create a first filter that is a function of the number of the filter elements n and the coefficients of the filter elements, and sets the number of the filter elements n and the coefficients of the filter elements based on a sample image. The filter creation portion 10 combines the distribution function $G_n$ of the nth order obtained when the filter is expanded into the n filter elements and the distribution function $G_0$ with an arbitrary weight coefficient to create a second filter. The filter creation portion sets the value of the number n and the weight coefficient based on the sample input signal.

The filter creation portion 10 sets the value of the number n, the coefficients of the filter elements, and the weight coefficient to maximize the S/N of the signal obtained by convolving the sample image using the created first and second filters.

First filters created based on sample images by the filter creation portion 10 and power spectra of the sample images are correlatively stored in the first filter storage portion 20. Second filters created based on the sample images by the filter creation portion 10 and S/Ns of the sample images are correlatively stored in the second filter storage portion 22. Preferably, a number of (e.g., about 100) sets of first filters created from sample images and respective power spectra of the sample images are stored in the first filter storage portion 20. Preferably, a number of (e.g., about 100) sets of second filters created from sample images and respective S/Ns of the sample images are stored in the second filter storage portion 22. The sample images can be SEM images taken from various samples and images of natural objects and artificial objects taken by a digital camera. In the present invention, multiple sets of such first filters and power spectra are previously stored in the first filter storage portion 20. Multiple sets of such second filters and S/Ns are previously stored in the second filter storage portion 22.

The first filter selection portion 30 calculates a power spectrum of an input image (represented by input signals) to be processed, selects a power spectrum approximate to the calculated power spectrum from power spectra stored in the first filter storage portion 20, selects a first filter corresponding to the selected power spectrum from the first filters stored in the first filter storage portion 20, and outputs the selected first filter to the third filter creation portion 50.

The second filter selection portion 32 calculates the S/N of the input image represented by the input signal, selects an S/N approximate to the calculated S/N from the S/Ns stored in the second filter storage portion 22, selects a second filter corresponding to the selected S/N from the second filters stored in the second filter storage portion 22, and outputs the selected second filter to the third filter creation portion 50.

The third filter creation portion 50 adds up the first and second filters selected in this way to create a third filter and outputs the created third filter to the convolutional processing portion 40.

The convolutional processing portion 40 convolves the input image using the third filter generated by the third filter creation portion 50. Furthermore, the convolutional processing portion 40 may convolve an input image, whose image size (spatial size) has been expanded by an image size expansion portion (not shown), using a selected filter. A spatial size restoration portion (not shown) may restore the spatial size of the output image convolved by the convolutional processing portion 40 to the spatial size of the input image.

2. Technique of Present Embodiment

The technique of the present embodiment is next described by referring to drawings.

2-1. Selection of First and Second Filters and Convolution

The image quality of an input image to be processed can be varied by convolving the input image using a filter of a distribution function. The convolutional processing portion 40 of the present embodiment performs convolutional processing as given by:

$$I_{out} = F_0 \otimes I_{in} \quad (1)$$

where $I_{in}$ indicates an input image, $I_{out}$ indicates an output image, and $F_0$ indicates a third filter generated by the third filter creation portion 50. Eq. (1) can be rewritten as follows:

$$I_{out}(x,y) = \iint_{X,Y \in R} I_{in}(x-X, y-Y) \times F_0(X,Y) dX dY \quad (2)$$

where x and y indicate the X- and Y-coordinates, respectively, of the input image, and X and Y indicate the X- and Y-coordinates, respectively, of the third filter. Usually, the input image is represented by discrete values and so Eq. (2) can be rewritten as follows:

$$I_{out}(nx, ny) = \sum_{NX} \sum_{NY} I_{in}(nx-NX, ny-NY) \times F_0(NX, NY) \quad (3)$$

where nx and ny indicate the numbers of pixels of the input image in the X- and Y-directions, respectively, and NX and NY indicate the numbers of pixels of the third filter in the X- and Y-directions, respectively.

The first filter selection portion 30 of the present embodiment operates to perform a discrete Fourier transform of the discrete input image $I_{in}\{ij\}$ using:

$$F_{pq} = \sum_{j=1}^{ny} \sum_{i=1}^{nx} I_{in}\{ij\} \exp\left\{-J2\pi\left(\frac{p \times (i+1)}{nx} + \frac{q \times (j-1)}{ny}\right)\right\} \quad (4)$$

where $J=\sqrt{-1}$.

Then, the first filter selection portion 30 calculates the power spectrum $PS_{in}(p,q)$ of the input image using:

$$PS_{in}(p,q) = \sqrt{Re(F_{pq})^2 + Im(F_{pq})^2} \quad (5)$$

The first filter selection portion 30 computes the error, err, between the power spectrum $PS_{in}(p,q)$ of the input image and each power spectrum $PS(p,q)$ stored in the first filter storage portion 20 using the equation:

$$err = \sqrt{\sum_{q=1}^{ny} \sum_{p=1}^{nx} (PS_{in}\{p,q\} - PS\{p,q\})^2} \quad (6)$$

The first filter selection portion 30 then selects one of the power spectra stored in the first filter storage portion 20 which minimizes the error, err, with the power spectrum of the input image, selects one of the first filters $F_{ex}$ stored in the first filter storage portion 20 which corresponds to the selected power spectrum, and outputs the selected spectrum and first filter to the third filter creation portion 50.

The second filter selection portion 32 of the present embodiment calculates the signal-to-noise ratio, $SN_{in}$, of the input image $I_{in}$ using the formula:

$$SN_{in} = \frac{\mu_{signal}}{\sigma_{noise}} \quad (7)$$

where $\mu_{signal}$ is the average of the input signal $I_{in}$ and $\sigma_{noise}$ is the standard deviation of the input signal $I_{in}$ as given by:

$$\mu_{signal} = \frac{\sum_{q=1}^{ny}\sum_{p=1}^{nx} I_{in}(p,q)}{nx \times ny} \quad (8)$$

$$\sigma_{noise}^2 = \frac{1}{nx \times ny}\sum_{q=1}^{ny}\sum_{p=1}^{nx}(I_{in}(p,q) - \mu_{signal})^2 \quad (9)$$

The second filter selection portion 32 then calculates the error, err, between the signal-to-noise ratio, $SN_{in}$, of the input image and each signal-to-noise, SN, stored in the second filter storage portion 22 using:

$$err = (SN_{in} - SN)^2 \quad (10)$$

The second filter selection portion 32 selects the S/N which minimizes the error, err, with the S/N of the input image from S/Ns stored in the second filter storage portion 22, selects the second filter $F_{ex}$ which corresponds to the selected S/N from the second filters stored in the second filter storage portion 22, and outputs the selected S/N and second filter $F_{ex}$ to the third filter creation portion 50.

The third filter creation portion 50 adds up the selected first filter $F_{ex}$ and second filter $F_{ex}$ to generate a third filter $F_0$, and outputs the generated third filter $F_0$ to the convolutional processing portion 40.

According to the present embodiment, a filter optimal for an input image can be obtained in a short processing time without repeating a processing operation for generating a filter adapted for the input image by selecting a first filter corresponding to a power spectrum most approximate to the power spectrum of the input image to be processed and selecting a second filter corresponding to an S/N most approximate to the S/N of the input image.

2-2. Creation of First and Second Filters

Figure 2:
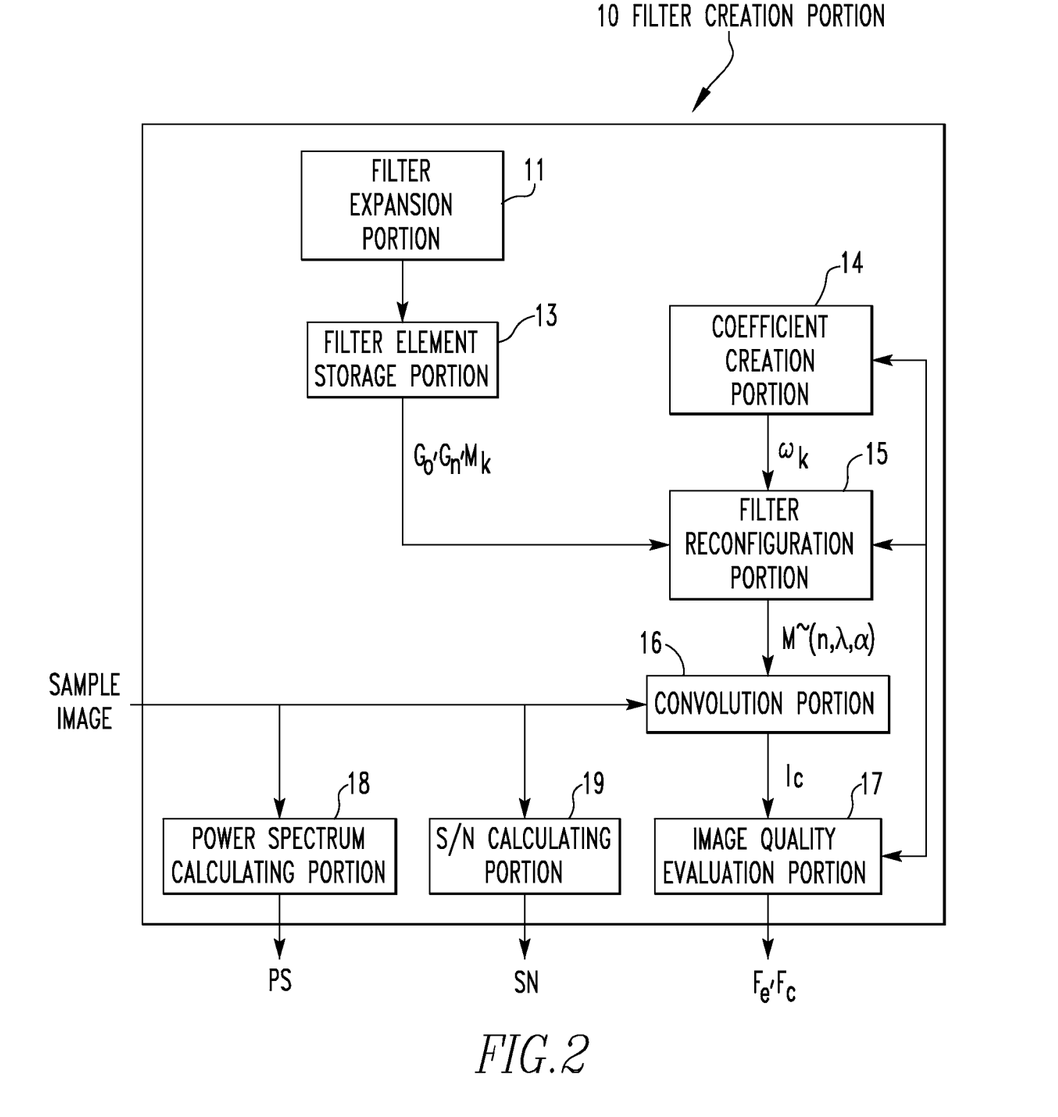
FIG. 2 is a detailed functional block diagram of the filter creation portion of the apparatus shown in FIG. 1.

FIG. 2 is a detailed functional block diagram of the filter creation portion 10 of the present embodiment.

The filter creation portion 10 includes a filter expansion portion 11, a filter element storage portion 13, a coefficient creation portion 14, a filter reconfiguration portion 15, a convolution portion 16, an image quality evaluation portion 17, a power spectrum calculating portion 18, and an S/N calculating portion 19.

The filter expansion portion 11 expands a filter of an arbitrary distribution function $G_0$ into a series of n filter elements (where n is an arbitrary number) each of which is the difference between two distribution functions.

Let $G_k$ be a two-dimensional distribution function (where k=0, 1, 2, ..., n (integer)). It is assumed that as the integer k increases, the standard deviation $\sigma_k$ of the distribution function $G_k$ increases. It is here assumed that the distribution function $G_k$ is a distribution function of the kth order. For example, if the distribution function $G_k$ is a two-dimensional Gaussian function, the distribution function $G_k$ and its standard deviation $\sigma_k$ are given by:

$$G_k(x,y) = \frac{1}{2\pi\sigma_k}\exp\left(-\frac{x^2+y^2}{2\sigma_k}\right) \quad (11)$$

$$\sigma_k = (k-1)\Delta\sigma + \sigma_k \quad (k \geq 1) \quad (12)$$
$$\sigma_k = \sigma_0 \cong 0 \quad (k=0)$$

If k=0 as given by Eq. (12), $G_0$ is approximate to a delta function (i.e., the dispersion $\sigma_0$ of $G_0$ is approximate to 0).

In the present embodiment, the distribution function $G_0$ approximate to the delta function is expanded into the sum of the distribution function $G_n$ of the nth order and a series of n filter elements each of which is a distribution function being the difference between two distribution functions. In this example, the distribution function $G_0$ is expanded as follows:

$$G_0 = G_n + (G_0 - G_n) \quad (13)$$

Expanding the second term of the right side of Eq. (13) similarly into n terms gives rise to:

$$G_0 = G_n + (G_0 - G_n) \quad (14)$$
$$= G_n + (G_0 - G_1) +$$
$$(G_1 - G_2) + (G_2 - G_3)\ldots +$$
$$(G_{n-1} - G_n)$$

Assuming that the kth expansion term is a filter element $M_k$ of the kth order and that the equation $M_k = G_{k-1} - G_k$ holds, Eq. (14) can be rewritten as:

$$G_0 = G_n + \sum_{k=1}^{n} M_k \quad (15)$$

As can be seen from Eq. (15), the distribution function $G_0$ has been expanded into the distribution function $G_n$ of the nth order and n filter elements $M_k$ (k=1 to n) each of which is the difference between the distribution function $G_{k-1}$ of the (k−1)th order and the distribution function $G_k$ of the kth order. As described later, the distribution function $G_n$ of the nth order is used when the second filter that is a noise filter is created. The n filter elements $M_k$ are used when the first filter being an edge enhancement filter is created.

Figure 3:
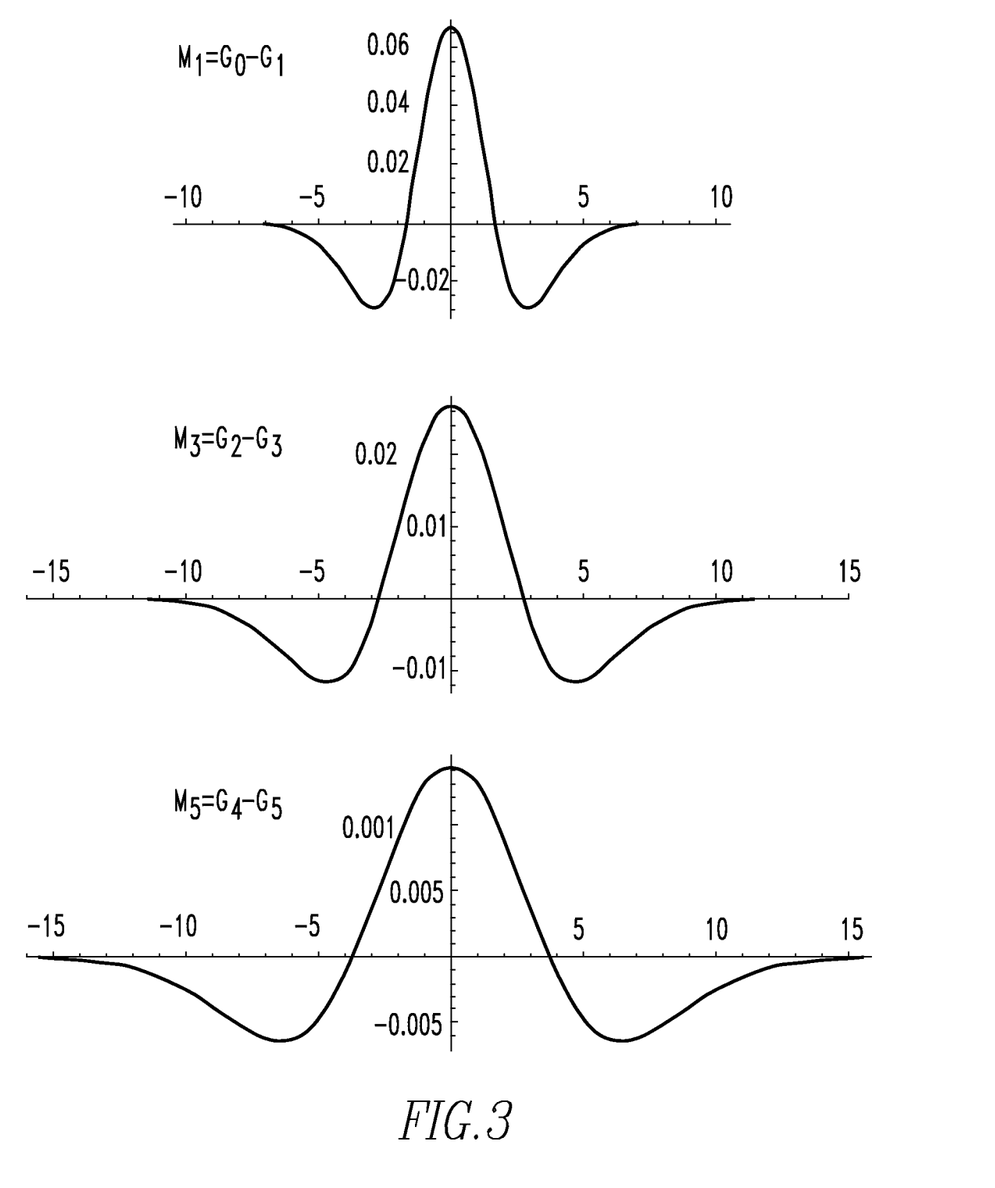
FIG. 3 shows examples of filter element obtained by expansion.

Examples of the filter elements $M_k$ are shown in FIG. 3, where $\Delta\sigma=0.5$, $\sigma_1=1.5$, and k=1, 3, and 5 in Eq. (12).

As shown in FIG. 3, each filter element $M_k$ is a differential filter that emphasizes the edges of the input image in the kth order. As the value of k of each filter element $M_k$ is increased, its dispersion increases. Therefore, a filter element $M_k$ having a small value of k acts as an edge enhancement filter acting on higher-frequency components of the input image. On the other hand, a filter element $M_k$ having a greater value of k acts as an edge enhancement filter acting on lower-frequency components of the input image.

The filter element storage portion 13 shown in FIG. 2 stores the distribution function $G_0$, the nth-order distribution function $G_n$ generated by the filter expansion portion 11, and the n filter elements $M_k$.

Figure 4:
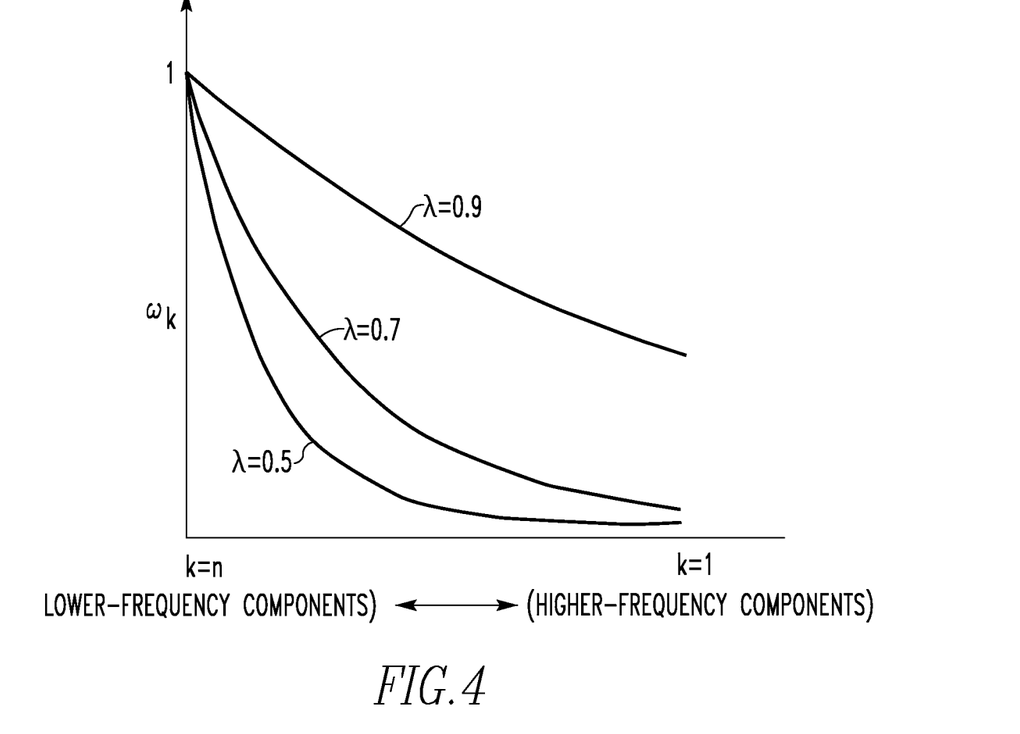
FIG. 4 is a graph illustrating the coefficients of the filter elements.

The coefficient creation portion 14 creates coefficients $\omega_k$ by which the n filter elements $M_k$ stored in the filter element storage portion 13 are respectively multiplied, for example, using the following formula:

$$\overline{\omega}_k = \lambda^{n-k} \quad (16)$$

where $\lambda$ is an arbitrary real number and preferably assumes a positive value from approximately 0.5 to 0.9. In the present embodiment, $\lambda$ is a real number less than unity. Therefore, a filter element $M_k$ (a filter element acting on low-frequency components of the image) having a large value of k has a large value of coefficient $\omega_k$ as shown in FIG. 4. On the other hand, a filter element $M_k$ (a filter element acting on high-frequency components of the image) having a small value of k has a small value of coefficient $\varpi_k$. That is, a filter element $M_k$ acting on higher-frequency components has the coefficient $\varpi_k$ whose value is attenuated to a greater extent, because power spectra of input images generally have large amounts of low frequency components. This can improve the resolution of the image while maintaining the apparent naturalness.

As shown in FIG. 4, when the value of $\lambda$ is varied, the coefficient $\varpi_k$ is attenuated to a different degree. For example, as the value of $\lambda$ is increased, the coefficient $\varpi_k$ is less attenuated, and the coefficient $\varpi_k$ of the filter element $M_k$ acting on higher-frequency components of the image can be increased. Conversely, as the value of $\lambda$ is reduced, the coefficient $\varpi_k$ is more attenuated, and the coefficient $\varpi_k$ of the filter element $M_k$ acting on higher-frequency components of the image can be reduced. That is, by varying the value of $\lambda$, the weight of each filter element $M_k$ acting on each frequency component of the image can be varied. FIG. 4 shows an example in which n=10.

Where one wants to perform image processing such as edge enhancement on certain frequency components of an input image, the coefficients $\varpi_k$ of filter elements $M_k$ acting on these frequency components are set to nonzero real numbers, and the coefficients $\varpi_k$ of the other filter elements $M_k$ are set to 0.

The filter reconfiguration portion 15 shown in FIG. 2 reconfigures a first filter $F_e(n,\lambda)$ that is a function of the number of filter elements n and of $\lambda$ featuring the coefficients $\varpi_k$, based on the n filter elements $M_k$ (k=1 to n) stored in the filter element storage portion 13 and on the coefficients $\varpi_k$ (k=1 to n) generated by the coefficient creation portion 14, using the following equation:

$$F_e(n, \lambda) = \sum_{k=1}^{n} \varpi_k \times Norm(M_k) \quad (17)$$

where Norm ( ) indicates normalization.

The first filter $F_e(n,\lambda)$ having various characteristics depending on the values of $\lambda$ and n can be created by adding up n filter elements $M_k$ (k=1 to n) multiplied by the coefficients $\varpi_k$ based on $\lambda$ so as to reconfigure a first filter that is an edge enhancement filter in this way. For example, as shown in FIG. 4, it is possible to create the first filter $F_e(n,\lambda)$ having filter elements $M_k$ which act on higher-frequency components and on which greater weights are attached by increasing the value of $\lambda$. Furthermore, the first filter $F_e(n,\lambda)$ acting on lower-frequency components can be created by increasing the value of the number n.

The filter reconfiguration portion 15 reconfigures a second filter $F_c(n,\alpha)$, based on the distribution function $G_0$ approximate to a delta function and on the distribution function $G_n$ of the nth order, the functions being stored in the filter element storage portion 13, by the use of the following equation:

$$F_c(n,\alpha)=(1-\alpha)\times Norm(G_0)+Norm(G_n) \quad (18)$$

where $\alpha$ is a weight coefficient having a value from 0 to 1. The second filter $F_c(n,\alpha)$ having different characteristics according to the values of n and a can be created by combining together the distribution function $G_0$ and the nth-order distribution function $G_n$ using the arbitrary weight coefficient $\alpha$ so as to reconfigure the second filter being a noise filter in this way.

Figure 5:
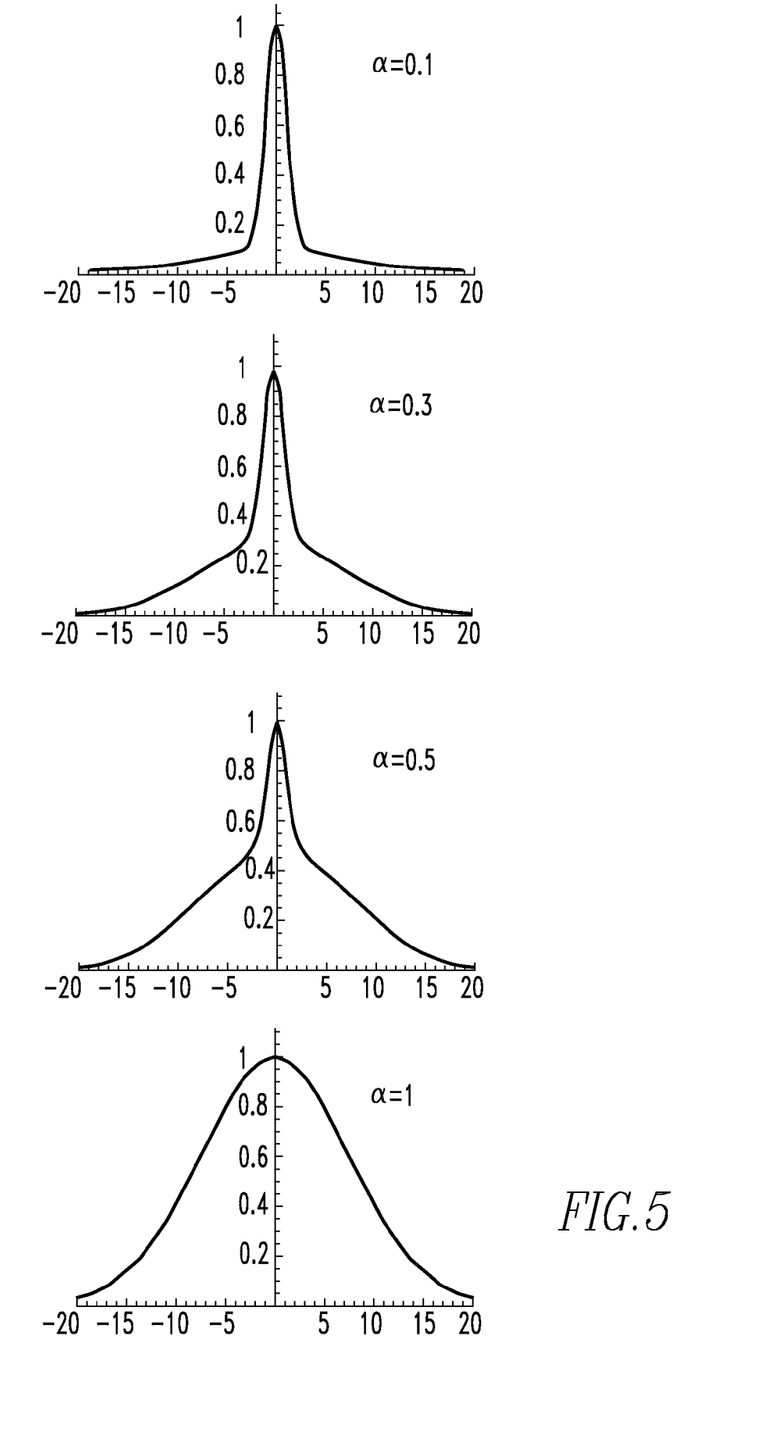
FIG. 5 shows one example of second filter.

An example of the second filter $F_c(n,\alpha)$ is shown in FIG. 5. As shown in FIG. 5, in this second filter $F_c(n,\alpha)$, high intensity portions are distributed around the center. Low intensity portions are distributed in long tail portions. This filter acts as a noise filter (blur filter) for removing noise from the input image.

As shown in FIG. 5, the level of filtering of the second filter $F_c(n,\alpha)$ shows a distribution function $G_0$ that approximates a delta function more closely as the value of the weight coefficient $\alpha$ is reduced. The distribution more closely approaches the nth-order distribution function $G_n$ that is a Gaussian function as the value of the weight coefficient $\alpha$ is increased. That is, the noise filtering action of the second filter $F_c(n,\alpha)$ can be weakened by reducing the value of the weight coefficient $\alpha$, and vice versa. Furthermore, since the dispersion of the distribution function $G_n$ increases with increasing the value of n, the second filter $F_c(n,\alpha)$ can be so designed as to act on higher-frequency components of the input image by reducing the value of n. The second filter $F_c(n,\alpha)$ can be designed such that it acts on the low-frequency components of the input image by increasing the value of n.

In the technique of the present embodiment, filter elements having a small size compared with the input image (e.g., 9×9 filter elements) are arranged and expanded to reconfigure each of the first and second filters. Therefore, the processing time can be much shortened compared with a wavelet technique in which the input image itself is expanded.

The filter reconfiguration portion 15 adds up the first filter $F_e(n,\lambda)$ and second filter $F_c(n,\alpha)$ to create an intermediate filter $\tilde{M}(n,\lambda,\alpha)$ for evaluation, using the following equation:

$$\tilde{M}(n,\lambda,\alpha)=F_e(n,\lambda)+F_c(n,\alpha) \quad (19)$$

Figure 6:
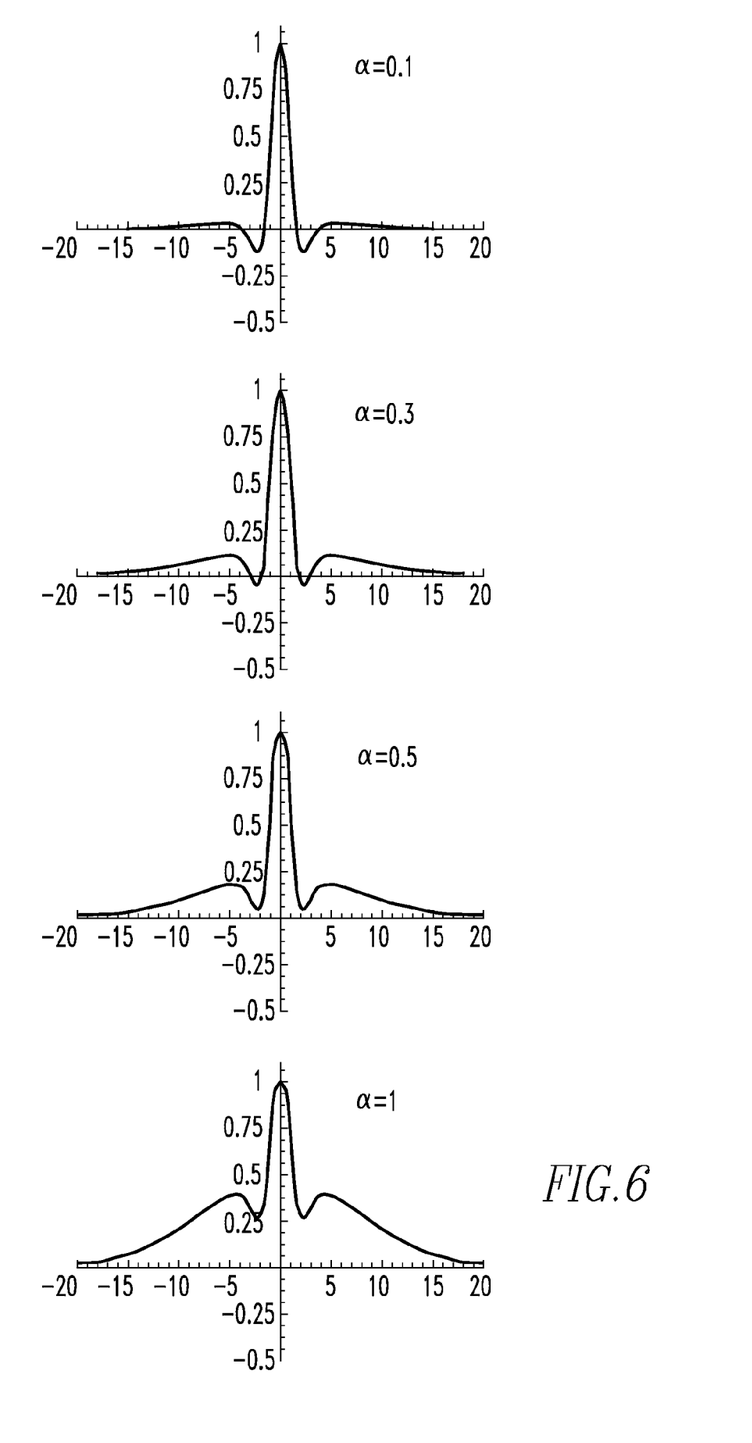
FIG. 6 shows one example of intermediate filter.

An example of the intermediate filter $\tilde{M}(n,\lambda,\alpha)$ is shown in FIG. 6. The third filter $F_0$ created by the third filter creation portion 50 is similar to the intermediate filter $\tilde{M}(n,\lambda,\alpha)$. As shown in FIG. 6, the intermediate filter $\tilde{M}(n,\lambda,\alpha)$ acts as an edge enhancement filter for emphasizing the edges of the input image and also as a noise filter for removing noise from the input image. Furthermore, as shown in FIG. 6, the intermediate filter $\tilde{M}(n,\lambda,\alpha)$ acts more as an edge enhancement filter with reducing the value of the weight coefficient $\alpha$. The intermediate filter acts more as a noise filter with increasing the value of the weight coefficient $\alpha$.

The convolution portion 16 shown in FIG. 2 creates an image $I_C$ by convolving the sample image $I_{in}$ using the intermediate filter $\tilde{M}(n,\lambda,\alpha)$ as given by the following formula, the intermediate filter $\tilde{M}(n,\lambda,\alpha)$ being created by the filter reconfiguration portion 15.

$$I_c=\tilde{M}(n,\lambda,\alpha)\otimes I_{in} \quad (20)$$

The image quality evaluation portion 17 similarly calculates the S/N of the image $I_c$ created by the convolution portion 16 using Eq. (7).

The convolution portion 16 creates the images by convolving a sample image using the intermediate filter $\tilde{M}(n,\lambda,\alpha)$ about all the combinations of n, $\lambda$, and $\alpha$ of the intermediate filter $\tilde{M}(n,\lambda,\alpha)$. The image quality evaluation portion 17 calculates the S/Ns of the created images $I_c$ and finds a combination of n, $\lambda$, and a that gives a maximum value of S/N using the following equation. The first filter $F_e(n,\lambda)$ having a combination of n and $\lambda$ that gives a maximum S/N is output as the first filter $F_c$ optimal for the sample image to the first filter storage portion 20 (see FIG. 1). The second filter $F_c(n,\alpha)$ having a combination of n and $\alpha$ that gives a maximum S/N is output as the second filter $F_c$ optimal for the sample image to the second filter storage portion 22 (see FIG. 1).

$$SN \to arg \cdot max\{SN|\forall n, \forall \lambda, \forall \alpha\} \quad (21)$$

The power spectrum calculating portion 18 calculates a power spectrum, PS, of a sample spectrum similarly to the case using Eq. (5) and outputs the calculated spectrum to the first filter storage portion 20. The optimum first filter $F_e$ created based on the sample image and the power spectrum PS of the sample image are correlatively stored in the first filter storage portion 20.

The S/N calculating portion 19 calculates the S/N, SN, of a sample image similarly to the case where Eq. (7) is used and outputs the result to the second filter storage portion 22. An optimum second filter $F_c$ created based on the sample image and S/N, SN, of the sample image are correlatively stored in the second filter storage portion 22.

The processing consisting of creating the first filter $F_e$ and second filter $F_c$ from the sample image and calculating the power spectrum PS and S/N of the sample image in this way is carried out for plural different sample images.

According to the present embodiment, it is possible to create the first filters $F_e$ and second filters $F_c$ which are optimal for the sample images among the first filters $F_e(n,\lambda)$ and second filters $F_c(n,\alpha)$ having various characteristics according to the values of n, $\lambda$, and $\alpha$.

First filters (edge enhancement filters) adapted for input images having power spectra approximate to power spectra of sample images can be easily selected by storing first filters $F_e$ optimal for the sample images correlatively with the power spectra of the sample images. Furthermore, second filters (noise filters) adapted for input images having S/Ns approximate to S/Ns of sample images can be easily selected by storing second filters $F_c$ optimal for the sample images correlatively with the S/Ns of the sample images. In addition, image processing can be performed by the use of a filter which is optimal for an input image and which acts as an edge enhancement filter and as a noise filter by convolving the input image using a third filter created by summing up the selected first and second filters.

For example, in response to an input image having a large amount of high-frequency components, a first filter having a large value of $\lambda$ and a small value of n is selected as an optimum first filter. As a result, a third filter more effectively acting on high-frequency components is created as a filter optimal for the input image. On the other hand, in response to an input image having a large amount of low-frequency components, a first filter having a small value of $\lambda$ and a large value of n is selected as an optimum first filter. As a result, a third filter more effectively acting on low-frequency components is created as a filter optimal for the input image.

In response to an input image having a high S/N, a second filter having a small value of $\alpha$ is selected as an optimum second filter. Consequently, a third filter (see FIG. 6) acting mainly as an edge enhancement filter is created as a filter optimal for the input image. On the other hand, in response to an input image having a low S/N, a second filter having a large value of $\alpha$ is selected as an optimum second filter. As a result, a third filter (see FIG. 6) acting mostly as a noise filter is created as a filter optimal for the input image.

3. Processing

Figure 7:
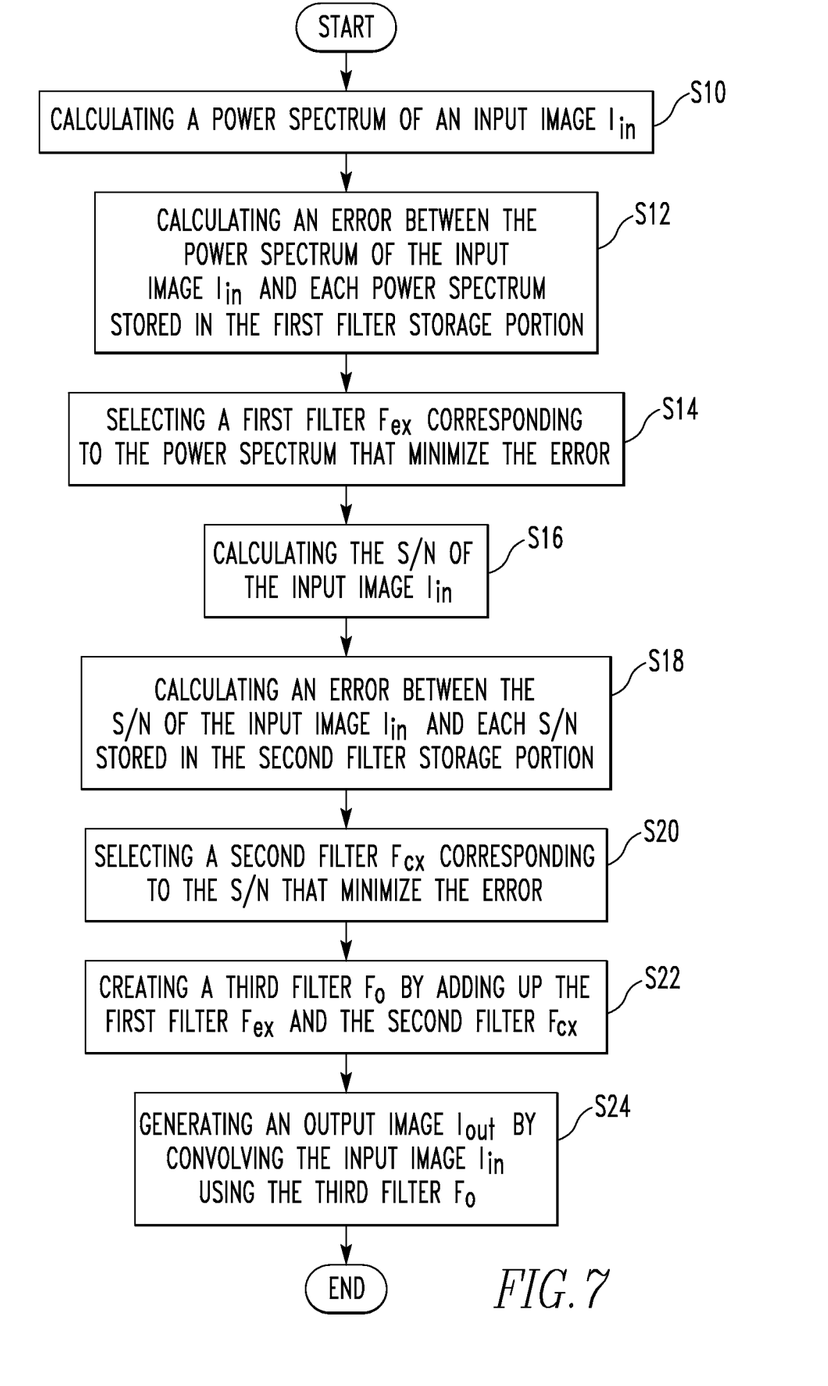
FIG. 7 is a flowchart illustrating one example of a sequence of operations performed by one embodiment of the invention.
Figure 8:
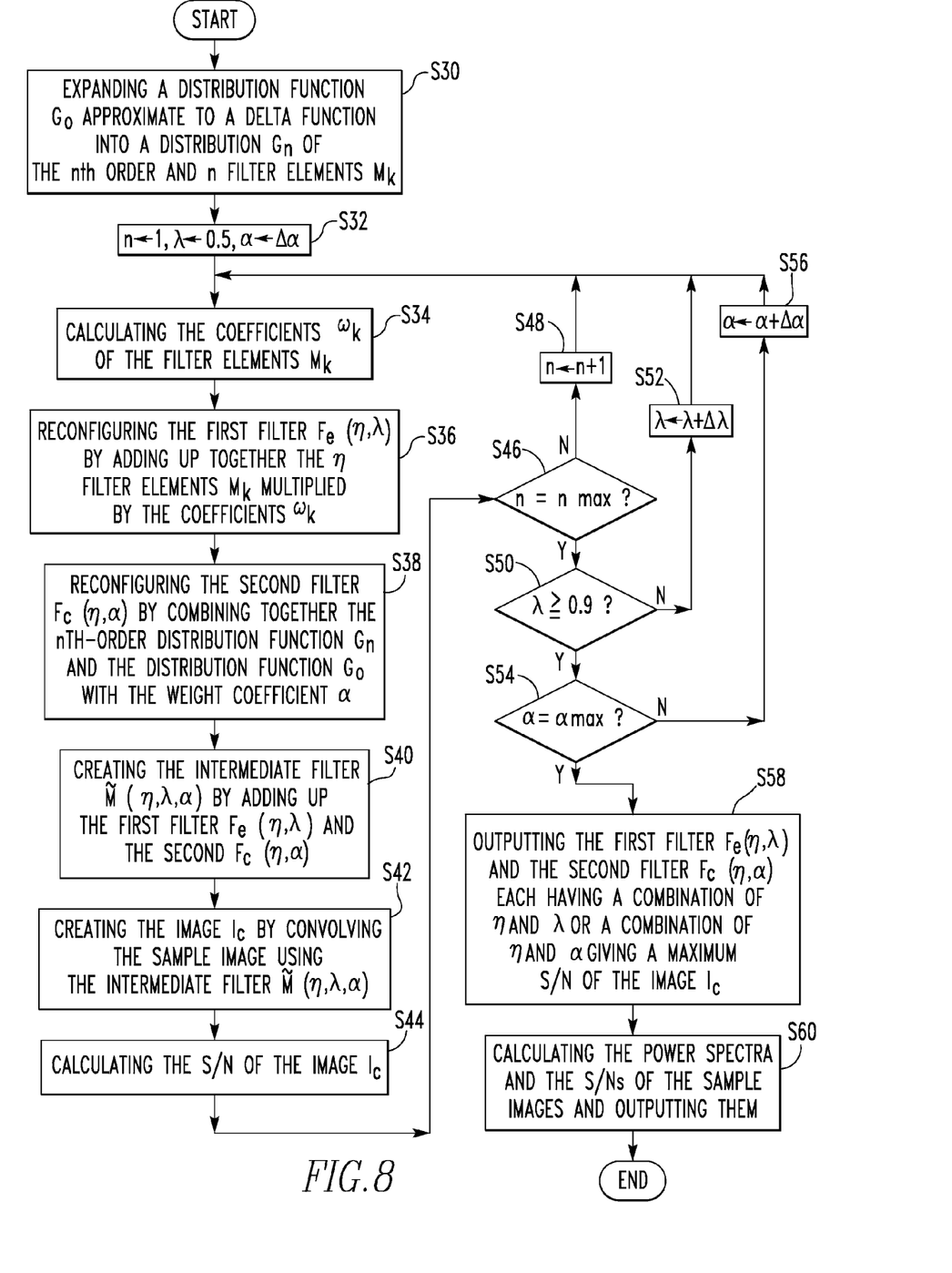
FIG. 8 is a flowchart illustrating one example of a sequence of operations performed by one embodiment of the invention.

One example of the processing performed in the present embodiment is next described by referring to the flowcharts of FIGS. 7 and 8. FIG. 7 is a flowchart illustrating examples of a filter selection process and convolutional processing.

First, the first filter selection portion 30 calculates a power spectrum of an input image $I_{in}$ using Eq. (5) (step S10). Then, the selection portion 30 calculates the error, err, between the power spectrum of the input image $I_{in}$ and each power spectrum stored in the first filter storage portion 20 using Eq. (6) (step S12). The selection portion selects the first filter $F_{ex}$ corresponding to the power spectrum that minimizes the error, err, with the power spectrum of the input image $I_{in}$ from the power spectra stored in the first filter storage portion 20 and reads the selected filter from the storage portion 20 (step S14).

Then, the second filter selection portion 32 calculates the S/N of the input image $I_{in}$ using Eq. (7) (step S16). The selection portion 32 then computes the error, err, between the S/N of the input image $I_{in}$ and each S/N stored in the second filter storage portion 22 using Eq. (10) (step S18). The selection portion selects a second filter $F_{ex}$ corresponding to the S/N that minimizes the error, err, with the S/N of the input image $I_{in}$ from S/Ns stored in the second filter storage portion 22, and reads the selected filter from the second filter storage portion 22 (step S20).

The third filter creation portion 50 then adds up the first filter $F_{ex}$ selected in step S14 and the second filter $F_{ex}$ selected in step S20 to create a third filter $F_o$ (step S22).

The convolutional processing portion 40 convolves the input image $I_{in}$ using the third filter $F_o$ created in step S22 to generate an output image $I_{out}$ (step S24).

FIG. 8 is a flowchart illustrating one example of processing performed by the filter creation portion 10.

First, the filter creation portion 10 expands a filter $G_0$ that is a distribution function approximate to a delta function into a distribution function $G_n$ of the nth order and n filter elements $M_k$ each of which is the difference between a distribution function $G_{k-1}$ of the (k−1)th order and a distribution function $G_k$ of the kth order using Eq. (15) (step S30).

Then, n and $\lambda$ are set to 1 and 0.5, respectively. $\alpha$ is set to $\Delta\alpha$ (0<$\Delta\alpha$<1; for example, $\Delta\alpha$=1) (step S32). The coefficients $\omega_k$ of the filter elements $M_k$ (k=1 to n) are computed using Eq. (16) (step S34).

Then, the first filter $F_e(n,\lambda)$ is reconfigured by adding up together the n filter elements $M_k$ multiplied by the coefficients $\omega_k$ using Eq. (17) (step S36). Then, the second filter $F_c(n,\alpha)$ is reconfigured by combining together the nth-order distribution function $G_n$ and the distribution function $G_0$ with the weight coefficient $\alpha$ using Eq. (18) (step S38).

Then, the first filter $F_e(n,\lambda)$ and the second filter $F_c(n,\alpha)$ are added up to create the intermediate filter $\tilde{M}(n,\lambda,\alpha)$ using Eq. (19) (step S40).

Then, the sample image is convolved using the intermediate filter $\tilde{M}(n,\lambda,\alpha)$ through Eq. (20) to generate the image $I_C$ (step S42). The S/N of the generated image $I_c$ is calculated using Eq. (7) (step S44).

Then, a decision is made as to whether the value of n has reached a given maximum value, nmax (step S46). If not so, the value of n is incremented by 1 (step S48) and then control proceeds to step S34. The processing subroutine starting with step S34 is repeatedly carried out until the value of n reaches the maximum value, nmax.

If the decision at step S46 is that the value of n has reached the maximum value, nmax, a decision is made as to whether the value of $\lambda$ has reached 0.9 (step S50). If the decision is NO, the value of $\lambda$ is incremented by $\Delta\lambda$ (step S52) and control goes to step S34. The processing subroutine starting with step S34 is repeatedly performed until the value of $\lambda$ reaches 0.9.

If the decision at step S50 is YES (i.e., the value of $\lambda$ has reached 0.9), a decision is made as to whether the value of $\alpha$ has reached a given maximum value, $\alpha$max (e.g., $\alpha$max=1) (step S54). If the decision at step S54 is NO, the value of $\alpha$ is incremented by $\Delta\alpha$ (step S56) and control proceeds to step S34. Then, the processing subroutine starting with step S34 is repeatedly performed until the value of $\alpha$ reaches $\alpha$max.

If the decision at step S54 is YES (i.e., the value of $\alpha$ has reached $\alpha$max (that is, the S/N of the image $I_c$ has been calculated for all the combinations of n, $\lambda$, and $\alpha$)), the first filter $F_e(n,\lambda)$ having a combination of n and $\lambda$, giving a maximum S/N is taken as an optimum first filter $F_e$ and output to the first filter storage portion 20. A second filter $F_c(n,\alpha)$ having a combination of n and $\alpha$ that gives a maximum S/N is taken as an optimum second filter $F_c$ and output to the second filter storage portion 22 (step S58).

Power spectra of sample images are then calculated using Eq. (5) and output to the first filter storage portion 20. The S/Ns of the sample images are calculated using Eq. (7) and output to the second filter storage portion 22 (step S60).

4. Example of Image Processing

Figure 9A:
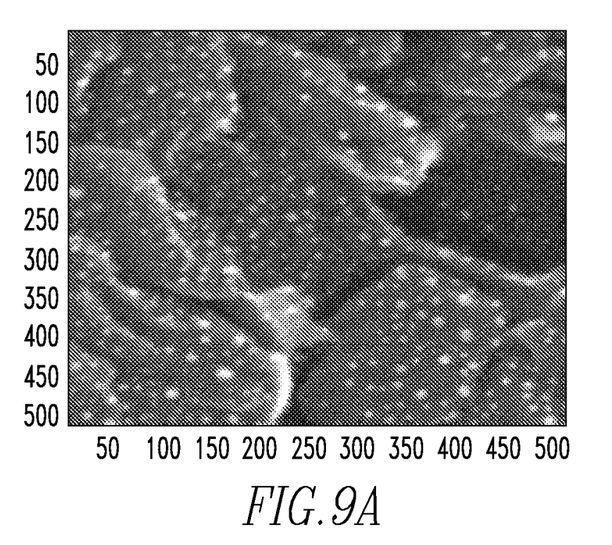
FIGS. 9A and 9B are images illustrating one example of image processing method according to the present invention.
Figure 9B:
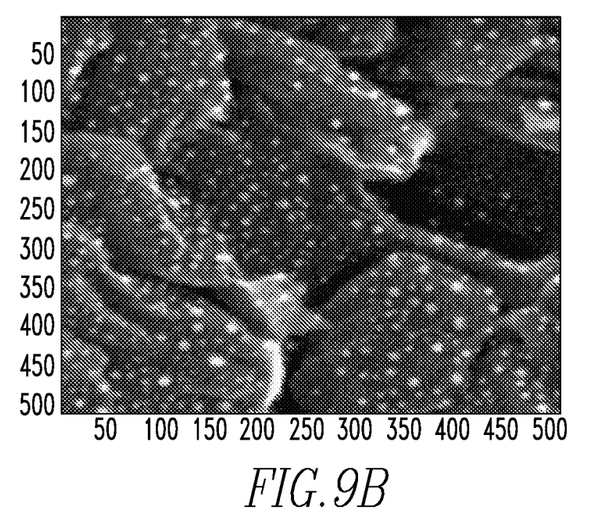

FIG. 9A shows one example of SEM image. FIG. 9B shows an output image obtained as a result of image processing of the input image that is the SEM image shown in FIG. 9A by the technique of the present embodiment. As shown in FIG. 9B, the technique of the present embodiment permits appropriate edge enhancement and noise removal of the input image. Consequently, the image quality (resolution) of the input image can be improved.

It is to be understood that the present invention is not restricted to the above embodiment but rather various changes and modifications may be made. The present invention embraces configurations substantially identical (e.g., in function, method, and results or in purpose and advantageous effects) with the configurations described in the preferred embodiment of the invention. Furthermore, the invention embraces configurations described in the embodiment and including portions which have non-essential portions replaced. In addition, the invention embraces configurations which produce the same advantageous effects as those produced by the configurations described in the preferred embodiment or which can achieve the same objects as the configurations described in the preferred embodiment. Further, the invention embraces configurations which are similar to the configurations described in the preferred embodiment except that well-known techniques have been added.

For instance, in the above embodiment, the present invention is applied to a case where image processing is applied to two-dimensional images. The invention can also be applied to signal processing of one-dimensional signal (such as audio signal).

Having thus described my invention with the detail and particularity required by the Patent Laws, what is desired protected by Letters Patent is set forth in the following claims.

The invention claimed is:

1. A method for signal processing, comprising the steps of:
  calculating a power spectrum of an input image signal;
  selecting a power spectrum approximate to the calculated power spectrum from a plurality of power spectra stored in a first filter storage portion;
  selecting a first filter corresponding to the selected power spectrum from a plurality of first filters stored in the first filter storage portion;
  calculating a S/N (signal-to-noise ratio) of the input signal;
  selecting a S/N approximate to the calculated S/N from a plurality of S/Ns stored in a second filter storage portion;
  selecting a second filter corresponding to the selected S/N from a plurality of second filters stored in the second filter storage portion;
  creating a third filter by adding up the selected first and second filters; and
  convolving the input signal using the created third filter.

2. A method for signal processing as set forth in claim 1, wherein the first filters stored in said first filter storage portion have been created by a step of creating filters based on sample input signals and are correlated with power spectra of the sample input signals, wherein the second filters stored in said second filter storage portion have been created by said step of creating filters and are correlated with S/Ns of the sample input signals, and wherein during said step of creating filters, a filter of an arbitrary distribution function $G_0$ is expanded into a series of n filter elements, where n is an arbitrary number, each of which is the difference between two distribution functions, coefficients of the filter elements are set at will, the filter elements are multiplied by the coefficients, respectively, and summed up to create the first filters being a function of n, where n is the number of the filter elements, and of the coefficients of the filter elements, the distribution function $G_n$ of the nth order obtained when expanding the filter into the n filter elements and the distribution function $G_0$ are combined together with arbitrary weight coefficients to create the second filters, and the value of n, the coefficients of the filter elements, and the weight coefficients are set based on the sample input signals.

3. A method for signal processing as set forth in claim 2, wherein during said step of creating filters, the value of number n, the coefficients of the filter elements, and the weight coefficients are set to maximize the S/Ns of the signals obtained by convolving the sample input signals using the created first and second filters.

4. A method for signal processing as set forth in any one of claims 2 and 3, wherein each of said distribution functions is a Gaussian function.

5. An apparatus for signal processing, comprising:
  a first filter storage portion in which first filters created based on sample input signals and power spectra of the sample input signals are correlatively stored;
  a second filter storage portion in which second filters created based on sample input signals and S/Ns (signal-to-noise ratio) of the sample input signals are correlatively stored;
  a first filter selection portion for calculating a power spectrum of an input signal, selecting a power spectrum approximate to the calculated power spectrum from the power spectra stored in the first filter storage portion, and selecting a first filter corresponding to the selected power spectrum from the first filters stored in the first filter storage portion;
  a second filter selection portion for calculating a S/N of the input signal, selecting a S/N approximate to the calculated S/N from the S/Ns stored in the second filter storage portion, and selecting a second filter corresponding to the selected S/N from the second filters stored in the second filter storage portion;
  a third filter creation portion for creating a third filter by summing up the selected first and second filters; and
  a convolutional processing portion for convolving the input signal using the created third filter.

6. An apparatus for signal processing as set forth in claim 5, wherein there is further provided a filter creation portion for creating the first and second filters based on the sample input signals and calculating power spectra and S/Ns of the sample input signals, and wherein said filter creation portion expands a filter of an arbitrary distribution function $G_0$ into a series of n filter elements, where n is an arbitrary number, each of which is the difference between two distribution functions, sets coefficients of the filter elements at will, multiplies the filter elements by the coefficients, respectively, and sums up the multiplied filter elements to create the first filter that is a function of the number of the filter elements n and of the coefficients of the filter elements, combines together a distribution function $G_n$ of the nth order obtained when expanding the filter into the n filter elements and the distribution function $G_0$ with an arbitrary weight coefficient to create the second filter, and sets the value of n, the coefficients of the filter elements, and the weight coefficient based on the sample input signals.

7. An apparatus for signal processing as set forth in claim 6, wherein said filter creation portion sets the value of the number n, the coefficients of the filter elements, and the weight coefficients to maximize the S/N of the signals obtained by convolving the sample input signals using the created first and second filters.

8. An apparatus for signal processing as set forth in any one of claims 6 and 7, wherein each of said distribution functions is a Gaussian function.

* * * * *